United States Patent [19]

Missele

[11] Patent Number: 5,088,007
[45] Date of Patent: Feb. 11, 1992

[54] COMPLIANT SOLDER INTERCONNECTION

[75] Inventor: Carl Missele, Elgin, Ill.

[73] Assignee: Motorola, Inc., Schaumburg, Ill.

[21] Appl. No.: 680,472

[22] Filed: Apr. 4, 1991

[51] Int. Cl.⁵ .............................................. H05K 7/20
[52] U.S. Cl. .................................. 361/386; 165/185;
228/248; 337/232; 361/403
[58] Field of Search ................ 357/81; 165/80.3, 185;
338/315, 329; 228/248, 180.2; 361/386, 387,
388, 400, 403, 410; 174/16.3, 94 R, 252, 261;
219/85.21; 337/232

[56] References Cited

U.S. PATENT DOCUMENTS

| | | | |
|---|---|---|---|
| 3,781,513 | 12/1973 | Bennett | 219/137 |
| 3,969,754 | 7/1976 | Kuniya | 357/65 |
| 4,290,195 | 9/1981 | Rippere | 228/248 |
| 4,740,252 | 4/1988 | Hasegawa | 228/248 |
| 4,922,068 | 5/1990 | Bangs | 200/271 |
| 4,937,435 | 6/1990 | Goss | 219/528 |
| 4,978,814 | 12/1990 | Honour | 174/94 R |

FOREIGN PATENT DOCUMENTS 0142698  5/1990  Japan ............................. 219/85.21

OTHER PUBLICATIONS

Tumala, R. R., et al., Microelectronics Packaging Handbook (1989), pp. 803–835.

*Primary Examiner*—Gerald P. Tolin
*Attorney, Agent, or Firm*—Douglas D. Fekete; Donald B. Southard

[57] ABSTRACT

An improved interconnection for mounting an electrical component to a substrate, such as a printed circuit board or the like, comprises an interwoven copper film mat embedded within a solder alloy matrix. The solder alloy is bonded to the component and to the substrate and extends continuously therebetween to provide a strong mechanical joint. The copper mat enhances electrical and thermal conductivity through the interconnection and improves compliant to relieve stresses of the type generated by differential thermal expansion of the component and the substrate during use.

2 Claims, 1 Drawing Sheet

U.S. Patent  Feb. 11, 1992  5,088,007
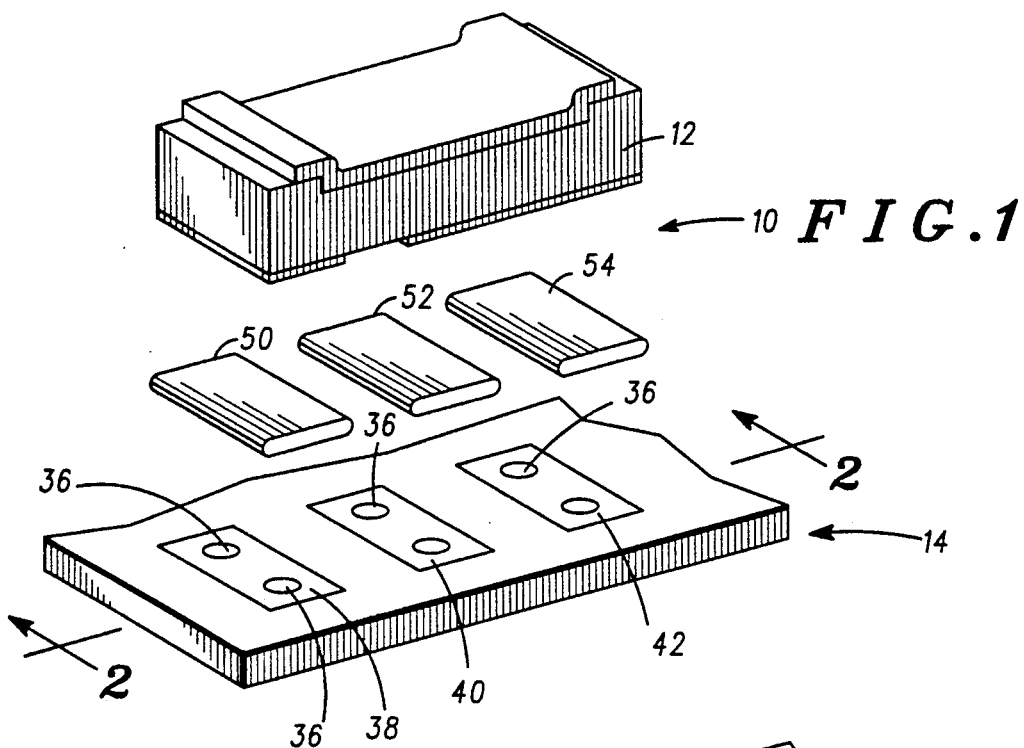
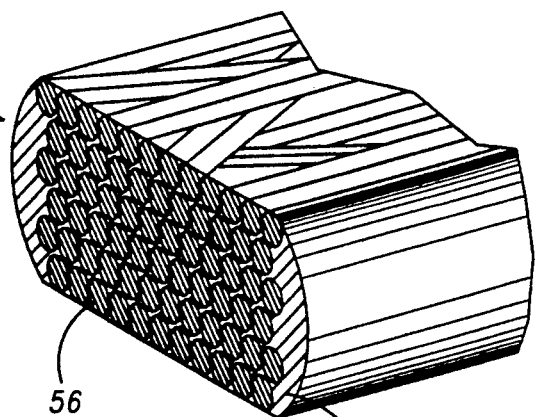
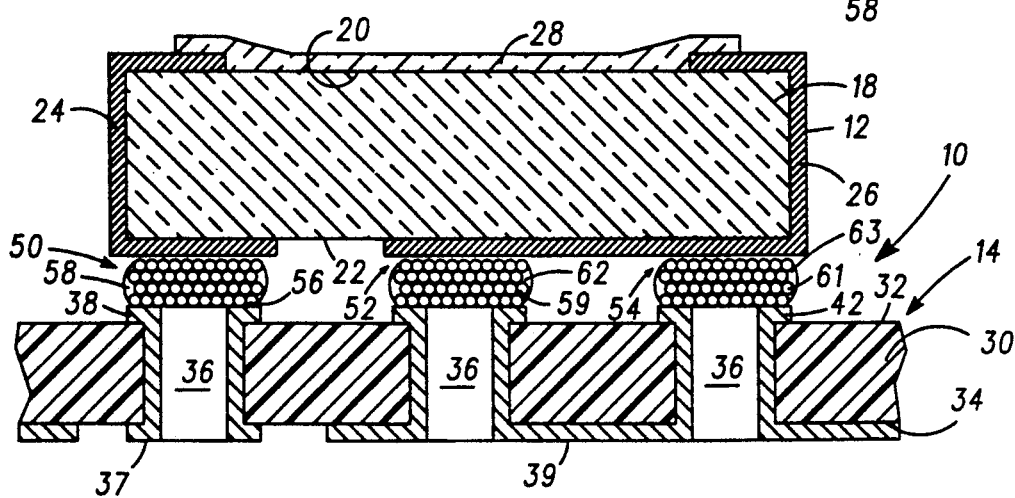

COMPLIANT SOLDER INTERCONNECTION

BACKGROUND OF THE INVENTION

This invention relates to an improved solder interconnection for mounting an electronic component onto a printed circuit board. More particularly, this invention relates to a solder interconnection comprising an interwoven copper fiber mat to enhance compliancy for resisting stresses due to thermal cycling without sacrifice to thermal and electrical conductivity required of the interconnection.

A typical electronic device comprises a component mounted onto a printed circuit board by a solder connection. For example, a power amplifier comprises a load resistor element soldered to the printed circuit board. The resistor is based upon a ceramic block that carries a resistive film, whereas the printed circuit board is formed of glass fiber-reinforced epoxy polymer. The solder joint extends between electroplated copper leads on the resistor element and also on the circuit board to electrically connect the resistive film to the circuit on the board. During operation, the resistor element generates heat, a portion of which is dissipated through the solder joint. In addition, this thermal cycling is accompanied by expansion and contraction of the element and the board, but at different rates due to the difference in the thermal expansion coefficients of the materials. This differential thermal expansion generates lateral stresses within the solder joint, which in turn may lead to breakage of the joint and failure of the circuit. Furthermore, the solder alloy used for the joints exhibit undesirably high electrical resistance and low thermal conductivity, particularly in comparison to preferred electrical circuit metals such as copper. Thus, it is desired to minimize the distance through the solder to minimize resistive current loss that would otherwise generate unwanted heat at the joint. It is also desired to minimize the solder gap between the copper leads to promote heat dissipation from the component.

Therefore, there has been a long standing need for a solder connection betwen a surface mounted electrical component and a substrate that has enhanced compliance to withstand stresses due to differential thermal expansion of the materials thereof, while minimizing the electrical and thermal conductive path through the solder that would otherwise retard electrical current flow and inhibit heat dissipation.

SUMMARY OF THE INVENTION

In accordance with this invention, a compliant composite interconnection is provided for mounting an electronic component onto a substrate in an electronic device. The interconnection comprises an interwoven copper fiber mat embedded within a solder body. The solder body is bonded to plated copper leads on the component and on the substrate and extends continuously therebetween to mechanically attach the component in the substrate. In addition, the mat of copper, fibers which features a multiplicity of interfiber contacts, provides an enhanced electrical and thermal pathway through the interconnection. This is attributed to the relatively low electrical resistance and high thermal conductivity of copper relative to the solder. Still further, the fibrous character of the mat assists in absorbing stresses generated during thermal cycling of the component. Thus, the composite solder interconnection in accordance with this invention exhibits improved compliancy to enhance durability of the connection and extend the useful life to the device, while providing an alternate copper network through the interconnection to reduce current and heat flow through the solder and thereby enhance the electrical and thermal properties of the interconnection.

BRIEF DESCRIPTION OF THE DRAWINGS

The present invention will be further described with reference to the accompanying drawings wherein:

FIG. 1 is an exploded, perspective view showing an electronic device comprising a compliant solder interconnection in accordance with this invention:

FIG. 2 is a cross-sectional view of the electronic device in FIG. 1, taken along the line 2—2 in the direction of the arrows;

FIG. 3 is a perspective view, partially in cross-section, showing a composite preform for forming an interconnection of FIG. 2.

DETAILED DECRIPTION OF THE INVENTION

In accordance with the preferred embodiment, referring the FIGS. 1 and 2, there is shown an electronic device 10 comprising a load resistor element 12 mounted onto a printed circuit board 14 by compliant copper fiber-reinforced solder interconnections 50, 52 and 54 in accordance with this invention. Referring in particular to FIG. 2, resistor element 12 is formed of a beryllium oxide block 18 having an upper surface 20 and a lower surface 22. Resistor element 12 further includes a plated copper positive lead that extends from the upper surface 20 to the lower surface 22 about one end of block 18 and a plated copper ground lead 26 that extends between the upper and lower surfaces about the opposite end of block 18. Leads 24 and 26 are spaced apart on upper surface 20 and connected by an electrically resistive film 28 composed of ruthenium dioxide dispersed in a glass matrix. Lead 26 covers a greater proportion of lower surface 22 but is spaced apart from lead 24 to prevent direct electrical communication, except across film 28.

Printed circuit board 14 comprises a glass fiber-reinforced epoxy polymer card 30 having an upper major surface 32 and a lower major surface 34 and further defining through-holes 36 arranged in three sets of pairs as shown in FIG. 1. Board 14 also includes a surface copper plate extending between upper surface 32 and lower surface 34 through through-holes 36. Copper plate is patterned at upper surface 32 to define pads 38, 40 and 42, each pad encompassing a pair of through holes 36. At lower surface 34, the copper plate is patterned to electrically isolate pad 38 from pads 40 and 42. In this manner, board 14 is adapted for connection to the resistor element through a positive lead 37 that includes pad 38 and a ground lead 39 that includes pads 40 and 42. Board 14 may include intermediate copper layers (not shown) that communicate with the leads, particularly with positive lead 37, to incorporate resistor element 12 into the electrical circuit. In a product package, board 14 rests against a suitable heat sink at the lower surface to extract heat from the copper plate and thereby dissipate heat generated by resistor element 12.

In accordance with this invention, component 12 is mounted onto printed circuit board 14 by three composite solder interconnections 50, 52 and 54. Referring to FIG. 3, there is shown a preform 60 for forming interconnection 50 and comprising a interwoven copper fiber mat 56 embedded within a matrix 58 formed of a solder alloy composed of about 40 percent lead and the balance tin. Mat 56 is formed of a section of a continuous copper fiber braid of the type used to form a shield electrode for a coaxial cable, in a collapsed condition. Mat 56 is preferably formed of metallic copper, but may be suitably formed of other solder wettable copper-base alloys. A solid piece of tin-lead solder alloy is set onto the braided section, heated to melt the solder, whereupon the molten solder is drawn into the braid as a result of capillary forces attributed to wetting of the copper fibers by the molten solder, and cooled to resolidify the solder. The solder penetrates the interstices within the copper braid to form a continuous matrix about the fibrous mat. Although coated by the solder alloy, the braided pattern is observable at the major surfaces of the preform as indicated in FIG. 3. The preform is then positioned on copper pad 38. Similar braided copper fiber preforms comprising mats 59 and 61 embedded within solder matrices 62 and 63 are set upon pads 40 and 42. Component 12 is assembled onto board 14 such that lead 24 rests against the preform for interconnection 50 and lead 26 rests against the preforms for interconnections 52 and 54. The assembly is heated and cooled to melt and resolidify the solder and thereby bond the solder matrices to the adjacent copper surface for leads 24 and 26 and pads 38, 40 and 42 to form interconnections 50, 52 and 54.

The resulting electronic device 10 thus features component 12 physically affixed to printed circuit board 14 by interconnections 50, 52 and 54. Mechanical strength for the interconnections is attributed to the continuous solder matrix. Furthermore, each interconnection comprises a copper fiber mat characterized by intimate interfiber contact that forms a continuous network through the interconnection. The fiber network lies adjacent the leads, separated at most by a minimal solder film. Because of the good electrical conductivity and good thermal conductivity of copper relative to the solder, the fiber network provides low resistance paths for electrical current and heat through the interconnection. As a result, the overall electrical resistance through the interconnection is reduced to facilitate electrical current flow between positive leads 24 and 37 and ground leads 26 and 39. During use, current flow across resistive film 28 generates heat that is absorbed by block 18 and heats element 12 and adjacent board 14. Heat is dissipated into a heat sink adjacent board surface 34 through interconnections 50, 52 and 54, facilitated by the copper fiber mats therein. Furthermore, the temperature increase is accompanied by thermal expansion of element 12 and board 14, but a different rates, thereby creating lateral stresses within the interconnection. The reinforcing fibers increase compliancy to reduce stresses particularly at the bonds to the copper leads, that would otherwise tend to produce fatigue, and thereby extends the useful life of device 10.

In the embodiment illustrated in the figures, the component is connected to the printed circuit board by one interconnection to the positive lead and two interconnections to the ground lead. Although the central interconnection 52 is electrically redundant, it is preferred to enhance heat dissipation from the central region of the component. The width of each interconnection was limited by the available copper brain used to form the corresponding preform. However, interconnections may be made in accordance with this invention using interwoven copper fiber mats of other suitable widths and lengths.

While this invention has been described in terms of certain embodiments thereof, it is not intended that it be limited to the above description but rather only to the extent set forth in the claims that follow.

The embodiments of the invention in which an exclusive property or privilege is claimed are defined as follows:

1. In an electronic device comprising a component attached to a substrate by a solder interconnection, the improvement comprising
    a composite interconnection comprising a solder body bonded to the component and the substrate and extending continuously therebetween to physically affix the component and the substrate, and an interwoven copper fiber mat embedded within the solder body to enhance electrical and thermal conduction through the interconnection.

2. In an electronic device comprising a ceramic-base component comprising a plated copper lead, and epoxy-base substrate comprising a plated copper pad on a surface thereof, and an interconnection bonding the component lead to the substrate pad, the improvement comprising
    a compliant interconnection composed of an interwoven copper fiber mat embedded within a metallic solder matrix, said matrix being solder bonded to the component lead and to the substrate lead and extending continuously therebetween to mechanically affix the component and the substrate, said mat being formed of interwoven copper fibers that enhances thermal and electrical conduction through the interconnection.

* * * * *